(12) United States Patent
Shahine

(10) Patent No.: US 7,746,909 B2
(45) Date of Patent: Jun. 29, 2010

(54) METHOD AND SYSTEMS FOR OPTIMIZING LASER AND ELECTRO-ABSORPTION MODULATOR PERFORMANCE FOR LONG-HAUL OPTICAL TRANSMISSION

(75) Inventor: Michael Haidar Shahine, Ellicott City, MD (US)

(73) Assignee: Ciena Corporation, Linthicum, MD (US)

( * ) Notice: Subject to any disclaimer, the term of this patent is extended or adjusted under 35 U.S.C. 154(b) by 20 days.

(21) Appl. No.: 11/606,507

(22) Filed: Nov. 30, 2006

(65) Prior Publication Data

US 2008/0130696 A1 Jun. 5, 2008

(51) Int. Cl.
*H01S 3/10* (2006.01)
(52) U.S. Cl. ...................................... 372/26
(58) Field of Classification Search ............ 372/26
See application file for complete search history.

(56) References Cited

U.S. PATENT DOCUMENTS 5,608,561 A * 3/1997 Marcuse et al. ............ 398/192
6,320,688 B1 * 11/2001 Westbrook et al. .......... 398/194
2003/0012244 A1 * 1/2003 Krasulick et al. ............ 372/50
2005/0008050 A1 * 1/2005 Fischer et al. ............ 372/38.1

OTHER PUBLICATIONS

Thomas L. Koch and Rod C. Alferness; "Dispersion Compensation by Active Predistorted Signal Synthesis", IEEE—Journal of Lightwave Technology, vol. LT-3, No. 4; Aug. 1985.
G. L. Li and P. K. L. Yu, IEEE and OSA Members; "Optical Intensity Modulators for Digital and Analog Applications"; IEEE—Journal of Lightwave Technology; vol. 21, No. 9; Sep. 2003.

* cited by examiner

*Primary Examiner*—Minsun Harvey
*Assistant Examiner*—Patrick Stafford
(74) *Attorney, Agent, or Firm*—Clements Bernard PLLC; Christopher L. Bernard; Tyler S. Brown

(57) ABSTRACT

The present invention provides a compact, low cost integrated continuous wave (CW) laser/electro-absorption (EA) modulator solution that supports the non-return to zero (NRZ) modulation format for long-haul optical transmission that results in high output extinction ratio of an integrated EA modulated laser (EML) and low modulator chirp. The methods and systems of the present invention treat the laser and EA modulator sections of the EML as separate components. An information signal is connected to two separate drivers: a laser driver that drives the laser section and a modulator driver that drives the EA modulator section.

11 Claims, 4 Drawing Sheets

METHOD AND SYSTEMS FOR OPTIMIZING LASER AND ELECTRO-ABSORPTION MODULATOR PERFORMANCE FOR LONG-HAUL OPTICAL TRANSMISSION

FIELD OF THE INVENTION

The present invention relates generally to methods and systems for optimizing laser and electro-absorption (EA) modulator performance for long-haul optical transmission. More specifically, the present invention relates to methods and systems that treat the laser and EA modulator sections of an integrated EA modulated laser (EML) as separate components. An information signal is connected (via a splitter) to two separate drivers: a laser driver that drives the laser section and a modulator driver that drives the EA modulator section. Using the methods and systems of the present invention, the output extinction ratio of the EML is increased and the modulator chirp is decreased.

BACKGROUND OF THE INVENTION

Today, long-haul optical transmission systems typically utilize a continuous wave (CW) laser and a separately mounted lithium-niobate Mach-Zehnder modulator as a transmitter due to the desirable properties of high output extinction ratio of the CW laser and low modulator chirp of the lithium-niobate Mach-Zehnder modulator. Disadvantageously, the use of "separate" components increases board space usage and, therefore, cost. There is currently no adequate compact, low cost integrated CW laser/EA modulator solution that supports the non-return to zero (NRZ) modulation format for long-haul optical transmission. Such integrated CW laser/EA modulator solution that supports the NRZ modulation format for long-haul optical transmission disadvantageously results in low output extinction ratio of the EML and high modulator chirp.

Koch et al. ("Dispersion Compensation by Active Predistorted Signal Synthesis," Journal of Lightwave Technology, Vol. LT-3, No. 4, August 1985) partially address this EML long-haul optical transmission problem, by predistorting a signal to include the inverse function of the fiber transfer function and modulating the laser, as well as the modulator, to remove the dispersion effect from the transmitted signal. Specifically, Koch et al. present a technique for high bit rate time division multiplexed optical transmission utilizing the synthesis of a predistorted signal to compensate for the dispersion effect. By utilizing dispersion as an integral part of the signal processing, bit rates can be achieved in excess of those at which dispersion otherwise prevents optical transmission.

What is still needed, however, is a compact, low cost integrated CW laser/EA modulator solution that supports the NRZ modulation format for long-haul optical transmission that results in high output extinction ratio of the EML and low modulator chirp.

BRIEF SUMMARY OF THE INVENTION

In various exemplary embodiments, the present invention provides a compact, low cost integrated CW laser/EA modulator solution that supports the NRZ modulation format for long-haul optical transmission that results in high output extinction ratio of the EML and low modulator chirp. The methods and systems of the present invention treat the laser and EA modulator sections of the EML as separate components. An information signal is connected (via a splitter) to two separate drivers: a laser driver that drives the laser section and a modulator driver that drives the EA modulator section.

In one exemplary embodiment, an integrated electro-absorption modulated laser system includes: a laser section; an electro-absorption modulator section integrated with the laser section; a laser driver that drives the laser section; and a modulator driver that drives the electro-absorption modulator section; wherein the laser driver and the modulator driver are separate and distinct components. The laser driver is operable for receiving an information signal and generating a laser driver signal that is transmitted to the laser section and the modulator driver is operable for receiving the information signal and generating a modulator driver signal that is transmitted to the electro-absorption modulator section. Preferably, the information signal is a non-return to zero signal. A one level of the information signal corresponds to approximately 0 V from the modulator driver, making the modulator section transparent to laser light. A zero level of the information signal corresponds to approximately −3 V from the modulator driver, making the modulator section absorb laser light. Preferably, the laser section is operated in a continuous wave mode and outputs a constant optical power level to the modulator section.

In another exemplary embodiment, an integrated electro-absorption modulated laser method includes: providing a laser section; providing an electro-absorption modulator section integrated with the laser section; driving the laser section with a laser driver; and driving the electro-absorption modulator section with a modulator driver; wherein the laser driver and the modulator driver are separate and distinct components. The method also includes receiving an information signal and generating a laser driver signal that is transmitted to the laser section with the laser driver and receiving the information signal and generating a modulator driver signal that is transmitted to the electro-absorption modulator section with the modulator driver. Preferably, the information signal is a non-return to zero signal. A one level of the information signal corresponds to approximately 0 V from the modulator driver, making the modulator section transparent to laser light. A zero level of the information signal corresponds to approximately −3 V from the modulator driver, making the modulator section absorb laser light. The method further includes operating the laser section in a continuous wave mode and outputting a constant optical power level to the modulator section.

In a further exemplary embodiment, an integrated electro-absorption modulated laser method includes: operating a laser section of an integrated electro-absorption modulated laser assembly in a continuous wave mode; outputting a constant optical power level to a modulator section of the integrated electro-absorption modulated laser assembly; modulating the laser section of the integrated electro-absorption modulated laser assembly via a laser driver; and modulating the modulator section of the integrated electro-absorption modulated laser assembly via a modulator driver. For a non-return to zero information signal, with a one level of the information signal corresponding to approximately 0 V from the modulator driver, selectively making the modulator section transparent to laser light. For the non-return to zero information signal, with a zero level of the information signal corresponding to approximately −3 V from the modulator driver, selectively making the modulator section absorb laser light.

BRIEF DESCRIPTION OF THE DRAWINGS

The present invention is illustrated and described herein with reference to the various drawings, in which like reference numbers denote like method steps and/or system components, as appropriate, and in which.

DETAILED DESCRIPTION OF THE INVENTION

The present invention provides a compact, low cost integrated CW laser/EA modulator solution that supports the NRZ modulation format for long-haul optical transmission that results in high output extinction ratio of the EML and low modulator chirp. The methods and systems of the present invention treat the laser and EA modulator sections of the EML as separate components. An information signal is connected (via a splitter) to two separate drivers: a laser driver that drives the laser section and a modulator driver that drives the EA modulator section. It should be noted that the EML was previously designed for short-haul optical transmission.

Figure 1:
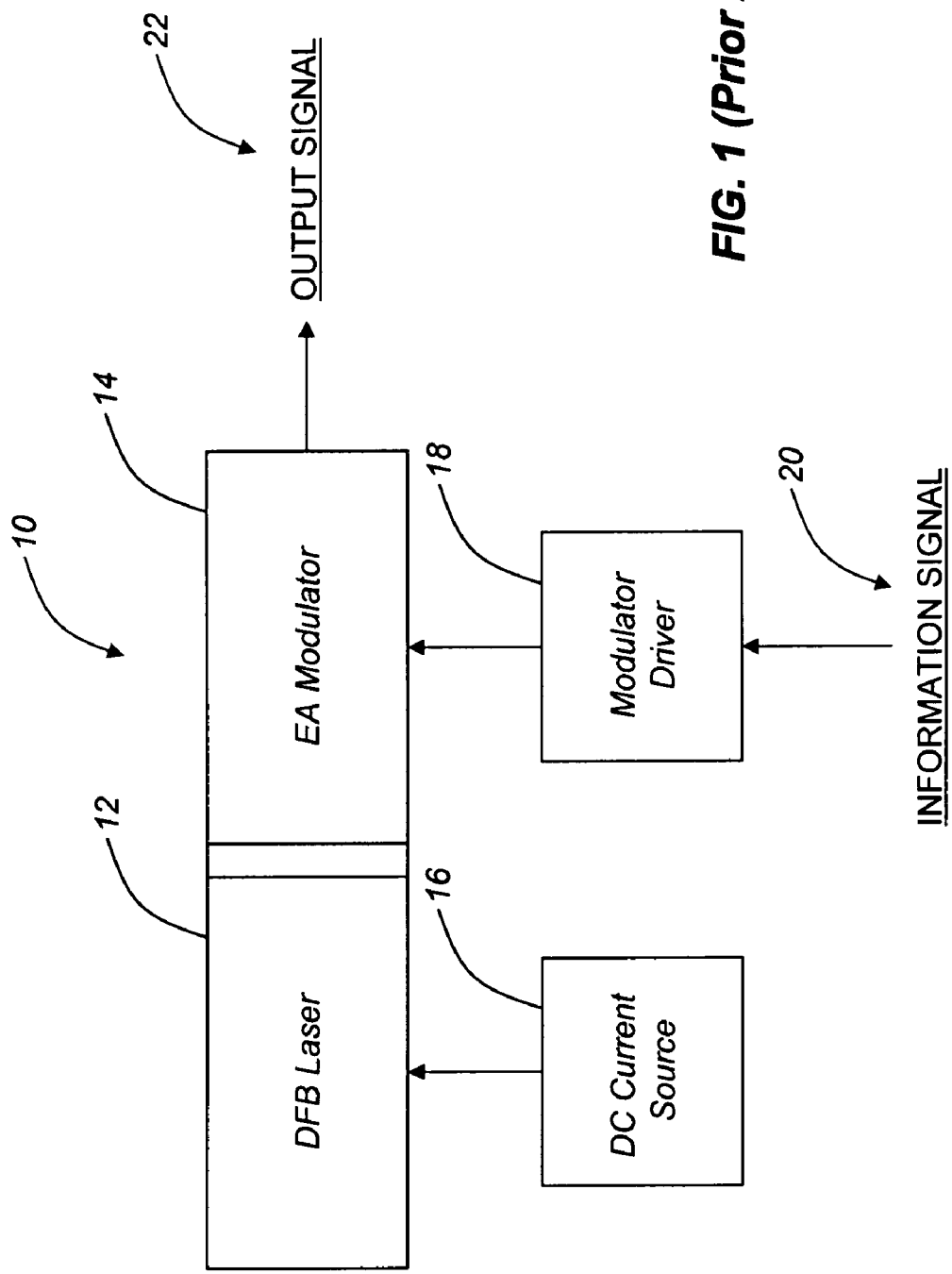
FIG. 1 is a schematic diagram illustrating a conventional EML, the EML incorporating a laser and an EA modulator, which are treated as one component, the laser connected to a direct current (DC) current source and the EA modulator connected to a modulator driver that drives the EA modulator.

Referring to FIG. 1, a conventional EML 10 includes a laser 12, such as a distributed feedback (DFB) laser or the like, and an EA modulator 14, which are treated as one component. The laser 12 is connected to a DC current source 16 and the EA modulator 14 is connected to a modulator driver 18 that drives the EA modulator 14. The modulator driver 18 exploits an information signal 20 and the output of the EML 10 is an output signal 22.

Figure 2:
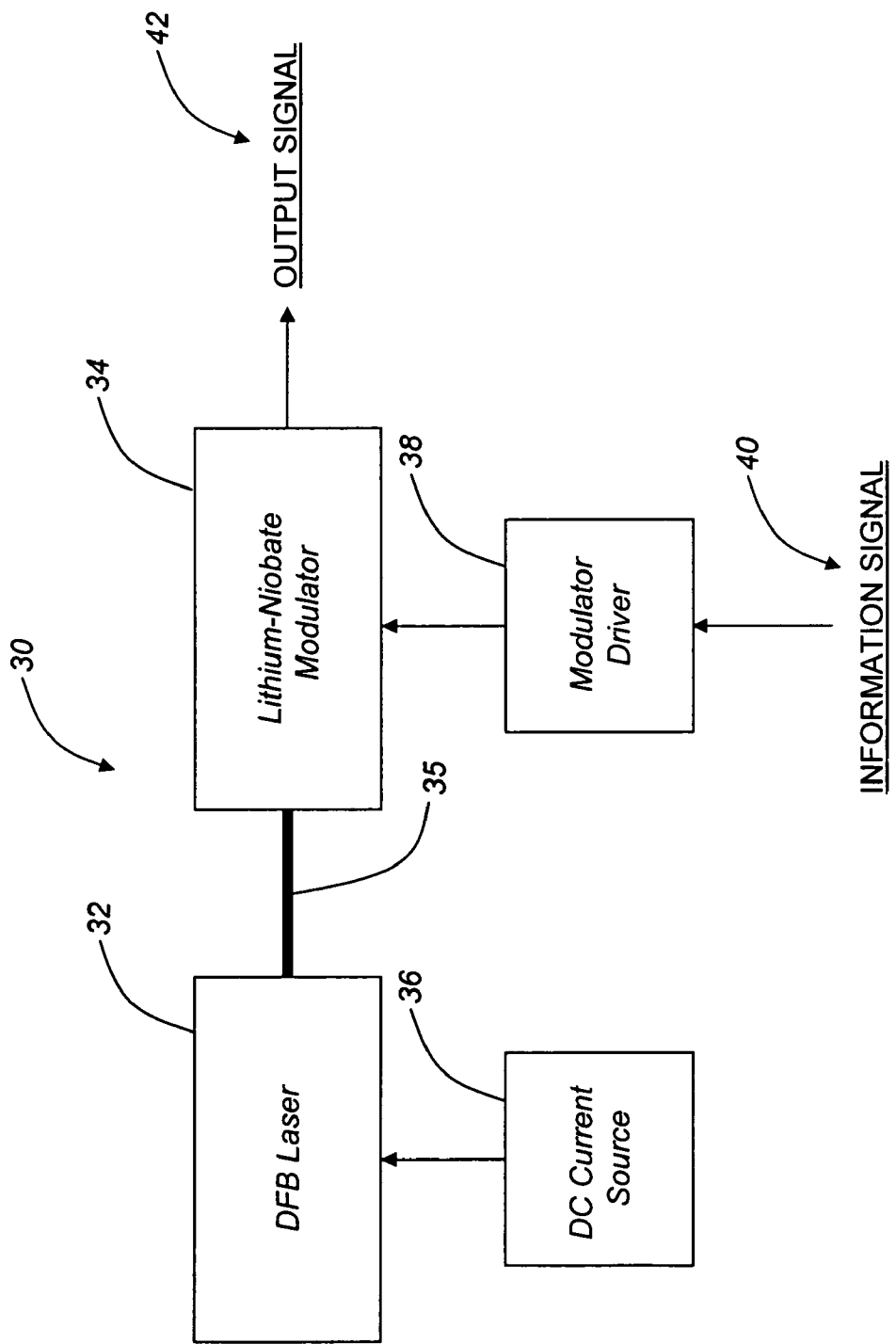
FIG. 2 is a schematic diagram illustrating a conventional CW laser and a separately mounted lithium-niobate modulator, which are treated as separate components, the CW laser connected to a DC current source and the lithium-niobate modulator connected to a modulator driver that drives the lithium-niobate modulator.

Referring to FIG. 2, a conventional CW laser and separately mounted lithium-niobate modulator 30 includes a laser 32, such as a DFB laser or the like, and a lithium-niobate modulator 34, which are treated as separate components. The laser 32 is coupled to the lithium-niobate modulator 34 via an optical fiber 35 or other waveguide. The laser 32 is connected to a DC current source 36 and the lithium-niobate modulator 34 is connected to a modulator driver 38 that drives the lithium-niobate modulator 34. The modulator driver 38 exploits an information signal 40 and the output of the CW laser and separately mounted lithium-niobate modulator 30 is an output signal 42.

As described by Li et al. ("Optical Intensity Modulators for Digital and Analog Applications," Journal of Lightwave Technology, Vol. 21, No. 9, September 2003), lightwaves have various characteristics that can be modulated to carry information, including intensity, phase, frequency, and polarization. Intensity modulation is the most popular for optical fiber communications systems due to the relative simplicity of envelope photodetection. Analog systems typically utilize small-signal modulation and are deployed for short-distance links, which is optimal at the 1.32 μm laser wavelength, where optical fiber has zero dispersion. The primary requirements are large incremental slope efficiency, wide bandwidth, high linearity, low noise, etc. Frequency chirp is not a concern due to the zero optical fiber dispersion. Digital systems typically utilize an ON/OFF modulation format and are deployed for long-distance links, which is optimal at the 1.55 μm laser wavelength to keep optical fiber loss low. The primary requirements are large ON/OFF extinction ratio, high data rate (i.e., wide bandwidth), low or controlled chirp, large signal-to-noise ratio (SNR), etc. Both require high optical power handling capability, small optical loss, polarization insensitivity, and stable performance over ambient temperature variations and time.

Intensity modulation can be implemented simply by directly modulating a laser source. This is common for semiconductor lasers. However, when the modulation frequency increases towards the relaxation resonance frequency of a semiconductor laser, both the relative intensity noise (RIN) and distortions increase rapidly. This severely limits the feasibility of direct modulation for high-frequency (>20 GHz) links. Large frequency chirp also precludes direct modulation for long-distance links. External modulation minimizes these effects, while adding system complexity and cost. Various external optical intensity modulators exist including lithium-niobate ($LiNbO_3$) modulators, semiconductor electro-absorption modulators (EAMs), semiconductor Mach-Zehnder modulators (MZMs), and polymer modulators.

In general, an EA modulator, or EAM, is a relatively simple device that makes use of the fact that a reverse-biased p-n junction is a strong absorber of light. In an EML, a laser and an EA modulator are built together on the same chip, with the output signal of the laser fed directly to the EA modulator. Loss caused by the EA modulator is on the order of 1 dB. A mirror and electrical isolation barrier are constructed between the laser and the EA modulator, the mirror acting as the exit mirror of the laser.

Figure 3:
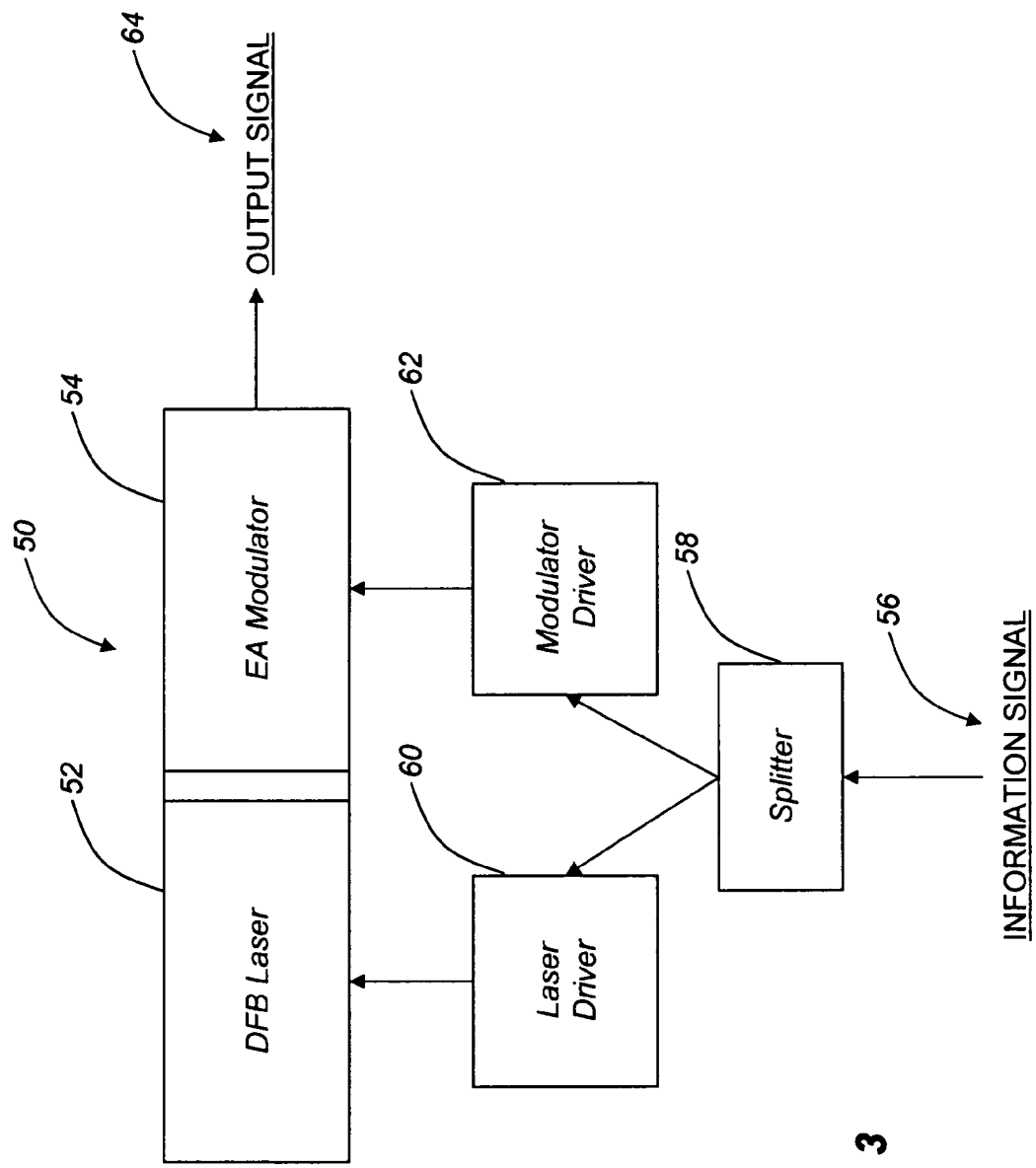
FIG. 3 is a schematic diagram illustrating one exemplary embodiment of the compact, low cost EML of the present invention, the compact, low cost EML incorporating a laser and an EA modulator, which are treated as separate components, and connected to two separate drivers: a laser driver that drives the laser and a modulator driver that drives the EA modulator.

Referring to FIG. 3, in one exemplary embodiment, the compact, low cost EML 50 of the present invention includes a laser 52, such as a DFB laser or the like, and an EA modulator 54, as described above, which are treated as separate components. An information signal 56 is split by a splitter 58 and connected to two separate drivers: a laser driver 60 that drives the laser 52 and a modulator driver 62 that drives the EA modulator 54. The result is an output signal 64.

The EML 50 of the present invention works by having the laser section (laser 52) operating in a CW mode, with the laser 52 outputting a constant optical power level to the modulator section (EA modulator 54). The modulator section is separately modulated with the information signal 56 through the modulator driver 62. For an NRZ signal, the one level of the information signal 56 corresponds to approximately 0 V from the modulator driver 62, which makes the modulator section transparent to laser light. The laser light passes through the modulator section to the optical fiber. For the zero level of the information signal 56, the modulator driver voltage is approximately −3 V, which makes the modulator section absorb the laser light coming from the laser 52. Not all of the laser light can be absorbed by the modulator section due to the inherent inefficiency of the component materials and the relatively high optical power coming out of the laser 52. This translates into the relatively low extinction ratio obtained using the EML 50 compared to that of a conventional EML assembly.

By definition, the extinction ratio is the optical power at the one level divided by the optical power at the zero level (ER=P1/P0). For a conventional EML assembly, the maximum ER that can be obtained is around 10 dB. For a conventional lithium-niobate modulator, the maximum ER that can be obtained is around 14 dB. Again, FIG. 1 illustrates the conventional EML assembly and FIG. 2 illustrates the conventional lithium-niobate modulator. By operating the EML 50 with the simultaneous modulation of both the laser and modulator sections, as suggested by the present invention, one can reduce the amount of optical power that the modulator section is required to absorb when the information signal 56 is at the zero level, enabling the EA modulator 54 to absorb most of the laser light, ultimately reducing the P0 level coming out of the EA modulator 54. This increases the ER of the output signal 64 from around 10 dB to around 14 dB, matching the conventional lithium-niobate modulator performance.

Figure 4:
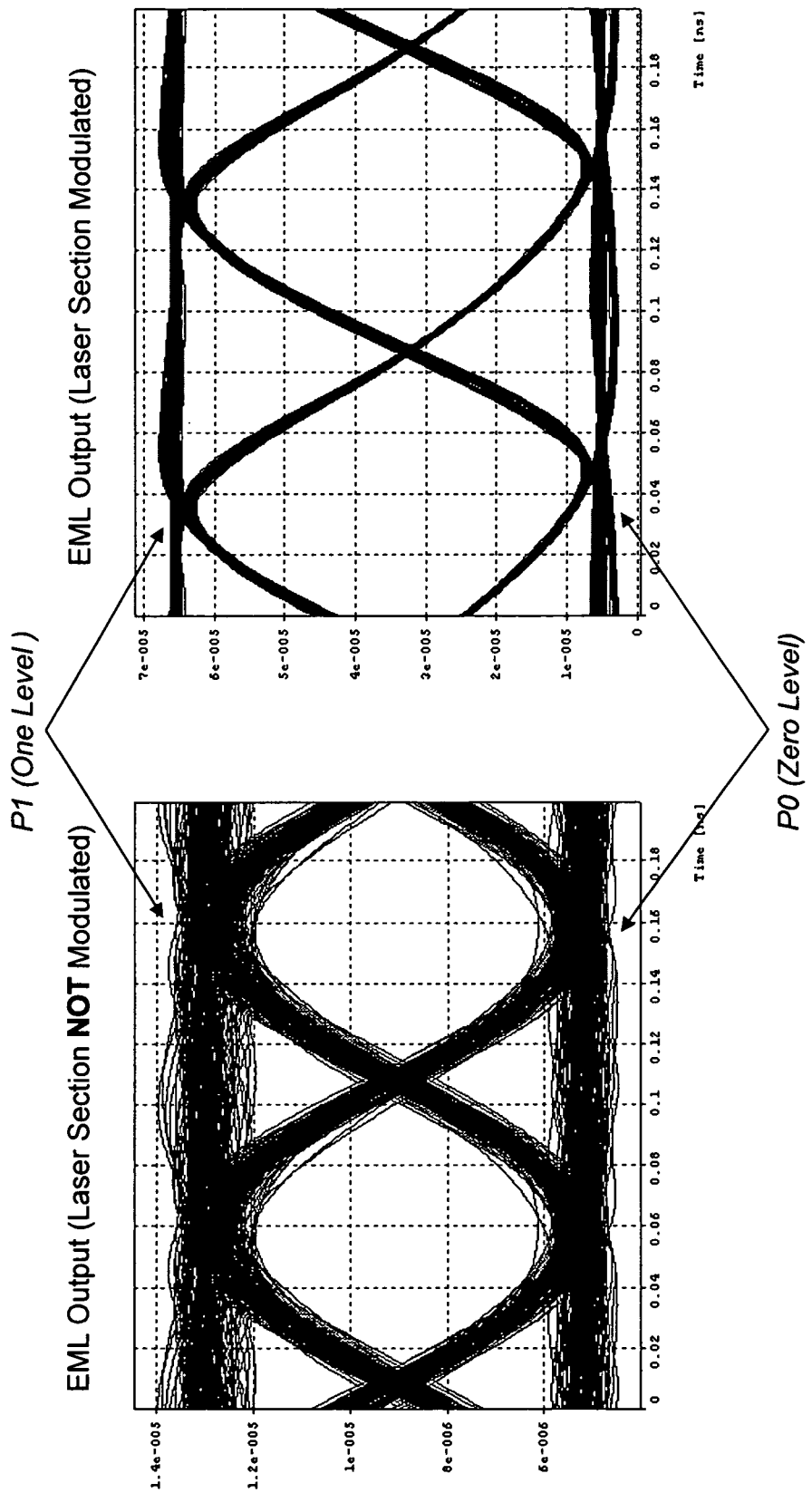
FIG. 4 is a series of plots (eye diagrams) illustrating the output of the compact, low cost EML of FIG. 3, both with the laser section not modulated (OFF) and with the laser section modulated (ON), highlighting the performance advantages of the compact, low cost EML of FIG. 3.

FIG. 4 is a series of plots (eye diagrams) illustrating the output of the compact, low cost EML 50 of the present invention, both with the laser section not modulated (OFF) and with the laser section modulated (ON), highlighting the performance advantages of the compact, low cost EML 50.

Although the present invention has been illustrated and described herein with reference to preferred embodiments and specific examples thereof, it will be readily apparent to those of ordinary skill in the art that other embodiments and examples can be utilized to perform similar functions and/or achieve like results. All such equivalent embodiments and examples are within the spirit and scope of the present invention and are intended to be covered by the following claims.

What is claimed is:

1. An integrated electro-absorption modulated laser system, comprising:
    a laser section;
    an electro-absorption modulator section integrated with the laser section;
    a laser driver that drives the laser section;
    a modulator driver that drives the electro-absorption modulator section; and
    a splitter connected to the laser driver and the modulator driver, wherein the splitter receives an information signal defining an on/off modulated signal and provides the same information signal to each of the laser driver and the laser and the modulator driver and the modulator thereby simultaneously modulating the laser and the modulator with the on/off modulated signal;
    wherein the laser driver is operable for receiving the information signal and generating a laser driver signal that is transmitted to the laser section and the modulator driver is operable for receiving the same information signal and generating a modulator driver signal that is transmitted to the electro-absorption modulator section;
    wherein the laser driver and the modulator driver are separate and distinct components; and
    wherein the information signal that is provided to both the laser driver and the modulator driver reduces optical power of the laser section during a zero level of the information signal thereby correcting an absorption deficiency of the electro-absorption modulator section.

2. The system of claim 1, wherein the information signal is a non-return to zero signal.

3. The system of claim 2, wherein a one level of the information signal corresponds to approximately 0 V from the modulator driver, making the modulator section transparent to laser light.

4. The system of claim 2, wherein a zero level of the information signal corresponds to approximately −3 V from the modulator driver, making the modulator section absorb laser light.

5. The system of claim 1, wherein the laser section is operated in a continuous wave mode and outputs a constant optical power level to the modulator section and wherein the constant output optical power is reduced responsive to a zero signal in the information signal thereby increasing the extinction ratio.

6. An integrated electro-absorption modulated laser method, comprising:
    providing a laser section;
    providing an electro-absorption modulator section integrated with the laser section;
    driving the laser section with a laser driver connected to a splitter;
    driving the electro-absorption modulator section with a modulator driver connected to the splitter;
    receiving, at the splitter, an information signal defining an on/off modulated signal;
    generating from the same information signal a laser driver signal that is transmitted to the laser section with the laser driver and a modulator driver signal that is transmitted to the electro-absorption modulator section with the modulator driver, wherein the same information signal is provided to both the laser section and the electro-absorption modulator section by the respective driver; and
    reducing optical power of the laser section based on the laser driver signal responsive to a zero level in the information system thereby correcting an absorption deficiency of the electro-absorption modulator section;
    wherein the laser driver and the modulator driver are separate and distinct components.

7. The method of claim 6, wherein the information signal is a non-return to zero signal.

8. The method of claim 7, wherein a one level of the information signal corresponds to approximately 0 V from the modulator driver, making the modulator section transparent to laser light.

9. The method of claim 7, wherein a zero level of the information signal corresponds to approximately −3 V from the modulator driver, making the modulator section absorb laser light.

10. The method of claim 6, further comprising operating the laser section in a continuous wave mode and outputting a constant optical power level to the modulator section.

11. An integrated electro-absorption modulated laser method, comprising:
    operating a laser section of an integrated electro-absorption modulated laser assembly in a continuous wave mode;
    outputting a constant optical power level into a modulator section of the integrated electro-absorption modulated laser assembly;
    receiving an information signal defining an on/off modulated signal and splitting the information signal;
    modulating the laser section of the integrated electro-absorption modulated laser assembly via a laser driver using the split information signal;

modulating the modulator section of the integrated electro-absorption modulated laser assembly via a modulator driver using the same split information signal;

wherein the same information signal is provided to both the laser section and the modulator section by the respective driver;

for a non-return to zero information signal, with a one level of the information signal corresponding to approximately 0 V from the modulator driver, selectively making the modulator section transparent to laser light; and for the non-return to zero information signal, with a zero level of the information signal corresponding to approximately −3 V from the modulator driver, selectively making the modulator section absorb laser light and selectively reducing optical power of the laser section based on the laser driver thereby correcting an absorption deficiency of the electro-absorption modulator section.

* * * * *